(12) United States Patent
Azuma et al.

(10) Patent No.: US 8,163,266 B2
(45) Date of Patent: Apr. 24, 2012

(54) ALPHA-ALUMINA POWDER

(75) Inventors: Norifumi Azuma, Ehime (JP); Shinji Fujiwara, Ehime (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 107 days.

(21) Appl. No.: 12/441,617

(22) PCT Filed: Sep. 18, 2007

(86) PCT No.: PCT/JP2007/068046
§ 371 (c)(1),
(2), (4) Date: Mar. 17, 2009

(87) PCT Pub. No.: WO2008/035656
PCT Pub. Date: Mar. 27, 2008

(65) Prior Publication Data
US 2010/0040535 A1     Feb. 18, 2010

(30) Foreign Application Priority Data
Sep. 19, 2006   (JP) ................................. 2006-252297

(51) Int. Cl.
*C01F 7/02*       (2006.01)
(52) U.S. Cl. ....................................... 423/625; 423/628
(58) Field of Classification Search ........... 423/625–630
See application file for complete search history.

(56) References Cited

U.S. PATENT DOCUMENTS
2005/0214201 A1    9/2005   Maruno et al.

FOREIGN PATENT DOCUMENTS

| | | |
|---|---|---|
| CN | 1565973 A | 1/2005 |
| EP | 0656319 A2 | 6/1995 |
| JP | 5-97569 A | 4/1993 |
| JP | 11-240777 A | 9/1999 |
| JP | 2001-302236 A | 10/2001 |
| JP | 2006-76799 A | 3/2006 |
| RU | 2136596 C1 | 9/1999 |
| SU | 1239097 A1 | 6/1986 |

OTHER PUBLICATIONS

Masato Kumagai et al., "Controlled Transformation and Sintering of a Boehmite Sol-Gel by α Alumina Seeding", J. Am. Ceram. Soc., 68 [9], 1985, pp. 500-505.

*Primary Examiner* — Edward Johnson
(74) *Attorney, Agent, or Firm* — Sughrue Mion, PLLC

(57) ABSTRACT

α-Alumina powder having a purity of at least 99.99% by weight, a specific surface area of from 0.1 to 2.0 m$^2$/g, a relative density of from 55 to 90%, and a closed porosity of 4% or less, wherein in a weight-based particle size distribution obtained by the dry sieving test according to JIS K0069 (1992), an amount of particles having a particle size of less than 75 μm is 5% by weight or less; an amount of particles having a particle size exceeding 2.8 mm is 15% by weight or less; and at least one frequency maximum peak appears in a particle size range of 100 μm or more and to less than 850 μm. This α-alumina powder can be charged in a crucible at a high bulk density, from which sapphire having a few voids can be produced without causing the oxidation of a crucible in a heat melting step.

4 Claims, No Drawings

ALPHA-ALUMINA POWDER

FIELD OF THE INVENTION

The present invention relates to α-alumina powder, particularly α-alumina powder suitable for producing sapphire.

BACKGROUND ART

α-Alumina powder is useful as a raw material for producing sapphire. For example, sapphire can be produced by charging α-alumina powder in a crucible made of metal molybdenum, heating and melting the α-alumina powder, and then pulling up the melt (Patent Literature 1: JP-A-05-097569).

It is highly desired to provide α-alumina powder which can be charged in a crucible at a high bulk density and is suitable for producing sapphire having a few voids without causing the oxidation of the crucible in a heat melting step.
Patent Literature 1: JP-A-05-097569

DISCLOSURE OF THE INVENTION

Problem to be Solved by the Invention

An object of the present invention is to provide α-alumina powder which can be charged in a crucible at a high bulk density and is suitable for producing sapphire having a few voids without causing the oxidation of the crucible in a heat melting step.

Means for Solving the Problem

Accordingly, the present invention provides α-alumina powder having a purity of at least 99.99% by weight, a specific surface area of from 0.1 to 2.0 m$^2$/g, a relative density of from 55 to 90%, and a closed porosity of 4% or less, wherein in a weight-based particle size distribution obtained by the dry sieving test according to JIS K0069 (1992), an amount of particles having a particle size of less than 75 μm is 5% by weight or less; an amount of particles having a particle size exceeding 2.8 mm is 15% by weight or less; and at least one frequency maximum peak appears in a particle size range of 100 μm or more and to less than 850 μm, provided that the particle size is the largest mesh size of a standard sieve through which α-alumina powder particle cannot pass among the standard sieves according to JIS Z8801 (1987).

According to one preferred embodiment of the present invention, in the above particle size distribution, an amount of particles having a particle size of 850 μm or more and less than 1 mm is 10% by weight or less, and at least one frequency maximum peak appears in a particle size range of at least 1 mm, wherein D2 and D1 satisfies the relationship (1):

$$2D_1 \leq D_2 \leq 20D_1 \quad (1)$$

and a ratio of M1 to M2 (M1/M2) is at least 0.05
wherein D2 is a maximum particle size corresponding to the frequency maximum peak having the largest maximum particle size among the frequency maximum peaks appearing in the above range and M2 is the maximum value thereof, and D1 is a maximum particle size corresponding to the frequency maximum peak having the smallest maximum particle size among the frequency maximum peaks appearing in a range of 100 μm or more and to less than 850 μm and M1 is the maximum value thereof.

In another preferred embodiment of the present invention, each content of Si, Na, Ca, Fe, Cu and Mg is 10 ppm or less.

In a further preferred embodiment of the present invention, the α-alumina powder is used as a raw material for the production of sapphire.

Effects of the Invention

The α-alumina powder of the present invention can be charged in a crucible at a high bulk density and scarcely oxidize the crucible in a heat melting step and furthermore, it provides a sapphire with a few voids by a method comprising heating and melting the α-alumina powder in a crucible and then pulling up the α-alumina.

PREFERRED EMBODIMENTS FOR CARRYING OUT THE INVENTION

The α-alumina powder of the present invention may be prepared by, for example, firing a mixture of an α-alumina precursor and α-alumina seed particles to obtain crude α-alumina powder and sieving the crude α-alumina powder.

An α-alumina precursor used in the above preparation method is a compound which can be converted to α-alumina by firing. Examples of such a compound include aluminum alkoxides such as aluminum isopropoxide, aluminum ethoxide, aluminum sec-butoxide, aluminum tert-butoxide, etc.; aluminum hydroxide; transition alumina such as γ-alumina, δ-alumina, θ-alumina, etc.; and the like.

Aluminum hydroxide may be obtained by hydrolyzing a hydrolysable aluminum compound. Examples of the hydrolysable aluminum compound include aluminum alkoxides, aluminum chloride, etc. Among them, aluminum alkoxides are preferable since aluminum hydroxide having a high purity such as a purity of 99.99% by weight or more can be obtained.

The kind of aluminum hydroxide is not particularly limited, but one having a high purity and a crystal system belonging to a boehmite crystal structure is preferable.

Hereinafter, the preparation of α-alumina powder according to the present invention will be explained using aluminum hydroxide as an α-alumina precursor by way of example.

α-Alumina seed particles used in the above method are obtained by milling high purity α-alumina particles with a purity of 99.99% by weight or more, and having a median particle size of from 0.1 to 1.0 μm, preferably from 0.1 to 0.4 μm. The α-alumina seed particles with a particle size of less than 0.1 μm are difficult to produce in an industrial scale, while α-alumina seed particles with a particle size exceeding 1.0 μm do not provide α-alumina powder having the specific surface area, relative density and closed porosity defined by the present invention.

As a method for producing the α-alumina seed particles used in the above method, a dry milling method comprising the milling the high purity α-alumina in a dry state, and a wet milling method comprising milling the high purity α-alumina in a slurry state with adding a solvent may be employed. Among them, the wet milling method is preferable from the viewpoint of the uniform mixing of the seed particles with aluminum hydroxide, which will be described below.

Examples of the wet-milling method for preparing the α-alumina seed particles include a milling method using a milling apparatus such as a ball mill, a medium agitation mill, etc. In such a milling method, water is usually used as a solvent. In addition, a dispersant may be added to the medium for carrying out milling to improve dispersibility. In order to keep a high purity, the dispersant is preferably a polymeric dispersant such as poly(ammonium acrylate), which can be evaporated off by firing and leaves no impurity.

To obtain the α-alumina seed particles, the milling apparatus used for milling α-alumina is preferably an apparatus in which a surface brought into contact with α-alumina is made of a high purity α-alumina or lined with a resin from the viewpoint of less contamination of the α-alumina seed particles obtained. In the case of milling using a medium agitation mill, etc., a milling medium is preferably made of high-purity α-alumina.

The amount of the α-alumina seed particles added to aluminum hydroxide in the above method is preferably from 0.1 to 10 parts by weight, more preferably from 0.3 to 7 parts by weight, per 100 parts by weight of the α-alumina particles after firing. When the amount of the α-alumina seed particles is less than 0.1 part by weight, the α-alumina powder of the present invention cannot be obtained. When the amount of the α-alumina seed particles exceeds 10 parts by weight, any physical property of the obtained α-alumina powder may not be modified, and the addition amount unnecessarily increases.

The amount of the slurry containing α-alumina seed particles used in the above method is usually from 100 to 200 parts by weight, preferably from 120 to 160 parts by weight, in terms of water in the slurry, per 100 parts by weight of aluminum hydroxide. When the amount of water exceeds 200 parts by weight, the mixture forms a slurry and thus a large amount of energy is unpreferably required for drying. When the amount of water is less than 100 parts by weight, the fluidity of the mixture becomes very low so that the α-alumina seed particles and aluminum hydroxide are insufficiently mixed.

A method for the addition of the αalumina seed particles may use stirring, ball milling, ultra sonic dispersion, etc. In general, the mixture containing aluminum hydroxide and the α-alumina seed particles is in such a state that the aluminum hydroxide particles with an average particle size of 5 μm or larger are agglomerated. Accordingly, a blade type mixer is preferably used, since it can mix the α-alumina seed particles while applying a shear force so as to uniformly mix them.

From the mixture of aluminum hydroxide and the α-alumina seed particles, water is removed by drying. A drying temperature is not particularly limited and is generally from 80 to 180° C. Furthermore, it is preferable to fluidize and dry the mixture using a fluidized layer dryer to improve the loosed bulk density of the α-alumina powder.

Subsequently, the mixture of the aluminum hydroxide and the α-alumina seed particles is fired. A firing temperature is usually from 1200 to 1450° C., preferably from 1250 to 1400° C., from the viewpoint of the easy production of the crude α-alumina powder having the purity, specific surface area, relative density and closed porosity defined by the present invention. When the firing temperature exceeds 1450° C., sintering excessively proceeds to decrease the specific surface area, to excessively increase the closed porosity, or to cause contamination of the α-alumina powder with impurities from a firing furnace. When the firing temperature is lower than 1200° C., the aluminum hydroxide may be insufficiently converted to the α-structure, or the sintering insufficiently proceeds so that the specific surface area tends to increase in some cases.

The mixture is heated to a firing temperature at a heating rate of 30° C./hr to 500° C./hr, for example. The firing residence time may be a sufficient period of time for causing the alphatization of aluminum hydroxide to obtain α-alumina having a density as prescribed. The residence time is usually from 30 minutes to 24 hours, preferably from 1 to 10 hours, although it varies with the kind of an aluminum compound used, a ratio of the α-alumina precursor to the α-alumina seed particles, the type of the firing furnace, the firing temperature, the firing atmosphere and the like.

The mixture may be fired in an air or in an inert gas such as nitrogen gas or argon gas. Alternatively, the firing may be carried out in a highly humid atmosphere with a high partial pressure of water vapor.

A commonly used firing furnace such as a tubular electric furnace, a box type electric furnace, a tunnel furnace, a far-infrared furnace, a microwave heating furnace, a shaft furnace, a reverberatory furnace, a rotary kiln, and a roller hearth kiln may be used for firing in the present invention. The mixture may be fired in a batch process or a continuous process. The firing may be carried out in a static state or in a fluidized state.

The α-alumina powder obtained by the above method has a purity of 99.99% by weight or higher, a specific surface area of from 0.1 to 2.0 $m^2/g$, preferably 0.2 to 1.0 $m^2/g$, a relative density of 55 to 90% and a closed porosity of 4% or less.

The crude α-alumina powder obtained by the above method usually has a wide particle size distribution. Thus, it is sieved to obtain α-alumina powder having the particle size distribution defined by the present invention.

In the α-alumina powder of the present invention, an amount of particles having a particle size of less than 75 μm is 5% by weight or less, preferably 3% by weight or less, in the particle size distribution of the dry sieving particle sizes measured by the dry sieving test according to JIS K0069 (1992). Furthermore, the α-alumina powder of the present invention contains no particle having a particle size of less than 75 μm, that is, the amount of particles having a particle size of less than 75 μm may be 0% by weight. When the amount of particles having a particle size of less than 75 μm is large, electrostatic repulsion among the particles increases so that the particles may not be charged in a crucible at a high bulk density, and furthermore, the particles may tend to clog a charging device with which the particles are charged in the crucible.

In the α-alumina powder of the present invention, the amount of particles having a particle size exceeding 2.8 mm is 15% by weight or less, preferably 10% by weight or less. More preferably, the α-alumina powder of the present invention contains no particle having a particle size exceeding 2.8 mm, that is, the amount of particles having a particle size exceeding 2.8 mm may be 0% by weight. When the amount of the particles having a particle size exceeding 2.8 mm is larger than 15% by weight, the particles cannot be charged in a crucible at a high bulk density.

The α-alumina powder of the present invention has at least one frequency maximum peak in a particle size range of 100 μm or more and to less than 850 μm, preferably in a particle size range of 100 μm or more and to less than 500 μm. The α-alumina powder of the present invention may consist of particles having a single particle size.

In the particle size distribution of the α-alumina powder of the present invention, the amount of particles having a particle size of 850 μm or more and less than 1 mm is 10% by weight or less, at least one frequency maximum peak appears in a particle size range of at least 1 mm, and D2 and D1 satisfies the relationship (1):

$$2D_1 \leq D_2 \leq 20D_1 \qquad (1)$$

and a ratio of M1 to M2 (M1/M2) is at least 0.05 wherein D2 is a maximum particle size corresponding to the frequency maximum peak having the largest maximum particle size among the frequency maximum peaks appearing in the above range, and M2 is the frequency thereof; and D1 is a maximum particle size corresponding to the frequency maximum peak having the smallest maximum particle size among the frequency maximum peaks appearing in a range of 100 μm or more and to less than 850 μm and M1 is the frequency thereof, from the viewpoint of charging.

From the viewpoint of the increase of a charging property of the particles, more preferably, D2 and D1 satisfies the relationship (2):

$$5D_1 \leqq D_2 \leqq 15D_1 \quad (2)$$

and a ratio of M1 to M2 (M1/M2) is preferably at least 0.1, more preferably at least 1.

In the present invention, the particle size means a dry sieving particle size, which is measured by using standard sieves having mesh sizes of 75 μm, 100 μm, 212 μm, 300 μm, 425 μm, 500 μm, 710 μm, 850 μm, 1 mm, 2 mm and 2.8 mm, respectively, which are defined by JIS Z8801 (1987), and determining the largest mesh size of the sieve through which the particles do not pass. The particle size distribution means a distribution of dry sieving particle sizes measured by the dry sieving test according to JIS K0069 (1992) using the above standard sieves.

Since the α-alumina powder of the present invention produced as described above has a purity of 99.99% or more and thus it contains less impurities, it is easily single crystallized by heating and melting it and then cooling it to produce sapphire. In addition, since the α-alumina powder of the present invention has a specific surface area of from 0.1 to 2.0 cm$^2$/g, preferably 0.2 to 1.0 cm$^2$/g, the amount of water adsorbed to the particle surfaces thereof from the atmosphere is small. Since the α-alumina powder of the present invention has a relative density of 55 to 90% and a closed porosity of 4% or less, the amount of water trapped by the closed cells in the production step is small, so that the α-alumina powder hardly oxidizes a crucible due to water during heating and melting, and voids formed in the sapphire decrease.

Since the α-alumina powder of the present invention has a particle size distribution defined by the present invention, it can be charged in a crucible at a high bulk density such as a loosed bulk density of at least 1.8 g/cm$^3$, preferably at least 2.0 g/cm$^3$, more preferably at least 2.2 g/cm$^3$.

The α-alumina powder obtained in the manner described above can be used as a raw material in a method for growing sapphire such as an EFG method, a Czochralski method, and the like.

EXAMPLES

Hereinafter, the present invention will be described more in detail by the following Examples, which do not limit the scope of the present invention in any way.

The evaluation methods used in the Examples are as follows:

(1) Relative Density

A sintered density was calculated from a closed pore volume, which was calculated from a pore volume (open pore volume) and a particle density, and used as the relative density of obtained α-alumina. The pore volume was measured as a pore volume of pores having a pore radius of 1 μm or less by a mercury intrusion method using an Autopore III 9420 mercury porosimeter (manufactured by Micrometrics Instrument Corporation) after drying a sample at 120° C. for 4 hours.

Relative density (%)=(Sintered density/3.98)×100

Sintered density (g/cm$^3$)=1/[(1/3.98)+pore volume+closed pore volume]

Closed pore volume (cm$^3$/g)=(1/particle density)−(1/3.98)

(2) Closed Porosity

A closed porosity was calculated from a particle density according to the following equation. A particle density was calculated according to a true specific gravity measurement method defined in JIS R7222.

Closed porosity (%)=[(closed pore volume)/{(1/3.98)+pore volume+closed pore volume}]×100

(3) Impurity Concentrations and Purity

The contents of Si, Fe, Cu and Mg were measured by a solid atomic emission spectrometry. The contents of Na and Ca were measured by an atomic absorption spectrometry and an ICP atomic emission spectrometry, respectively, after alkali fusion.

A purity is the total amount of Al$_2$O$_3$ contained in α-alumina, and was calculated by calculating the total amount (ppm) of Si$_2$, MgO, CuO, Fe$_2$O$_3$, CaO and Na$_2$O from the impurity concentrations and subtracting the calculated amount from 1 (one). The calculation equation was as follows:

Purity (%) 100×{1−[total amount of impurities (ppm)]}

(4) Particle Size Distribution

Particle size distribution was measured according to the dry sieving test according to JIS K0069 (1992) using standard sieves having mesh sizes of 75 μm, 100 μm, 212 μm, 300 μm, 425 μm, 500 μm, 600 μm, 710 μm, 850 μm, 1 mm, 2 mm and 2.8 mm, respectively, among the standard sieves designated by JIS Z8801 (1987).

(5) Loosed Bulk Density

A loosed bulk density was measured according to JIS R9301-2-3 by charging a sample in a standard container and calculated from the weight and volume of the sample charged.

(6) Average Particle Size

The average particle size of the α-alumina seed particles was measured by a laser diffraction method using a laser particle size distribution measurement apparatus (Microtrack manufactured by Nikkiso Co., Ltd.) and a particle size corresponding to the size of particles at a cumulative percentage of 50% by weight was used as an average particle size.

(7) Specific Surface Area

A specific surface area was measured by a nitrogen adsorption method using a BET specific surface area measurement apparatus (2300-PC-1A manufactured by Shimadzu Corporation.

(8) Amount of Water

The amount of water adsorbed by α-alumina powder was measured according to JIS H1901-1977 by drying a sample of the α-alumina powder at 110° C. and measuring a decreased weight, which was used as an amount of water.

Example 1

High purity α-alumina (trade name: AKP-53 manufactured by Sumitomo Chemical Co., Ltd.) was used as α-alumina seed particles. The α-alumina was milled with a wet ball mill to prepare a slurry of α-alumina seed particles which contained 20 parts by weight of the alumina seed particles in terms of a solid content. The alumina seed particles had an average particle size of 0.25 μm.

High purity aluminum hydroxide obtained by the hydrolysis of an aluminum alkoxide was used as an α-alumina precursor. The α-alumina seed particles and aluminum hydroxide were mixed with a blender type mixer having, on its inner surface, agitation blades with a multi-step cross-shaped decomposition structure rotatable at a high speed. The amount of α-alumina contained in the α-alumina seed particle slurry added in the mixing step was 1.7 parts by weight per 100 parts by weight of α-alumina to be prepared. The amount of water in the slurry was 149 parts by weight per 100 parts by weight of aluminum hydroxide. After mixing, the mixture was dried with a fluidized layer drying apparatus to evaporate water off and an α-alumina precursor powder containing α-alumina seeds was obtained. The powder was heated at a heating rate of 100° C./hr and fired at a temperature of 1335° C. for 4 hours to obtain an α-alumina powder.

This powder had a relative density of 87% and a closed porosity of 2.4%. In the weight-based particle size distribution of this powder, the amount of particles having a particle size of less than 75 μm was 2.0% by weight, the amount of particles having a particle size exceeding 2.8 mm was 4.6% by weight, one frequency maximum peak appeared in a range of 100 μm or more and to less than 212 μm. Furthermore, the amount of particles having a particle size of 850 μm or more and less than 1 mm was 3.4% by weight, and one frequency maximum peak appeared in a range of 1 mm or more and less than 2 mm, D2 was 10 times larger than D1, and the M1/M2 ratio was 1.19, and thus the loosed bulk density of the powder was 2.3 g/cm$^3$. The contents of Si, Na, Mg, Cu, Fe and Ca in the powder were 7 ppm, 2 ppm or less, 2 ppm, 1 ppm or less, 6 ppm, and less than 2 ppm, respectively, the alumina purity was 99.99%, the specific surface area was 0.4 m$^2$/g, and the amount of water adsorbed was 0.02% by weight. That is, the obtained α-alumina powder contained a small amount of water adsorbed and had a low closed porosity and a high loosed bulk density.

Example 2

The α-alumina powder prepared in the same manner as in Example 1 was sieved to obtain α-alumina powder having a particle size of 100 μm or more and to less than 850 μm. This powder had one frequency maximum peak in a range of 100 μm or more and to less than 212 μm in the weight-based particle size distribution and a loosed bulk density of 2.1 g/cm$^3$. Thus, this powder was α-alumina powder having a high loosed bulk density.

Example 3

The α-alumina powder prepared in the same manner as in Example 1 was sieved to obtain α-alumina powder having a particle size of 100 μm or more and to less than 500 μm. This powder had one frequency maximum peak in a range of 100 μm or more and to less than 212 μm in the weight-based particle size distribution and a loosed bulk density of 1.9 g/cm$^3$. Thus, this powder was α-alumina powder having a high loosed bulk density.

Examples 4 to 10

The α-alumina powder prepared in the same manner as in Example 1 was sieved to obtain α-alumina powder having a particle size of 100 μm (Example 4), 212 μm (Example 5), 300 μm (Example 6), 400 μm (Example 7), 500 μm (Example 8), 600 μm (Example 9) or 710 μm (Example 10). Each powder had one frequency maximum peak in a range of 100 μm or more and to less than 850 μm in the weight-based particle size distribution and a loosed bulk density of 1.8 to 1.9 g/cm$^3$. Thus, the powder was α-alumina powder having a high loosed bulk density.

Example 11

The α-alumina powder prepared in the same manner as in Example 1 was sieved to obtain α-alumina powder. In the weight-based particle size distribution of this powder, the amount of particles having a particle size of less than 75 μm was 0.3% by weight, the amount of particles having a particle size exceeding 2.8 mm was 12.3% by weight, one frequency maximum peak appeared in a range of 100 μm or more and to less than 212 μm, the amount of particles having a particle size of 850 μm or more and less than 1 mm was 3.4% by weight, one frequency maximum peak appeared in a range of 1 mm or more and less than 2 mm, D2 was 10 times larger than D1, and the M1/M2 ratio was 0.06. This α-alumina powder had a loosed bulk density of 1.8 g/cm$^3$. Thus, the powder was α-alumina powder having a high loosed bulk density.

Example 12

The α-alumina powder prepared in the same manner as in Example 1 was sieved to obtain α-alumina powder. In the weight-based particle size distribution of this powder, the amount of particles having a particle size of less than 75 μm was 2.0% by weight, the amount of particles having a particle size exceeding 2.8 mm was 9.2% by weight, one frequency maximum peak appeared in a range of 425 μm or more and less than 500 μm, the amount of particles having a particle size of 850 μm or more and less than 1 mm 3.4% by weight, one frequency maximum peak appeared in a range of 1 mm or more and less than 2 mm, D2 was twice larger than D1, and the M1/M2 ratio was 0.14. This α-alumina powder had a loosed bulk density of 2.1 g/cm$^3$. Thus, the powder was α-alumina powder having a high loosed bulk density.

Example 13

α-Alumina powder was prepared in the same manner as in Example 1 except that 0.26 part of the α-alumina seed particles was added per 100 parts by weight of α-alumina to be obtained and the amount of water in the slurry was changed to 150 parts by weight per 100 parts by weight of aluminum hydroxide to obtain a mixture of the α-alumina precursor and the α-alumina seed particles, and the dried mixture was fired at a temperature of 1310° C. for 4 hours.

This powder had a relative density of 66% and a closed porosity of less than 0.01%. In the weight-based particle size distribution of this powder, the amount of particles having a particle size of less than 75 μm was 1.3% by weight, the amount of particles having a particle size exceeding 2.8 mm was 2.9% by weight, one frequency maximum peak appeared in a range of 100 μm or more and to less than 212 μm. Furthermore, the amount of particles having a particle size of 850 μm or more and less than 1 mm was 4.0% by weight, and one frequency maximum peak appeared in a range of 1 mm or more and less than 2 mm, D2 was 10 times larger than D1, and the M1/M2 ratio was 1.50, and the loosed bulk density of the powder was 1.8 g/cm$^3$. The contents of Si, Na, Mg, Cu, Fe and Ca in the powder were 7 ppm, 2 ppm or less, 1 ppm, 2 ppm, 5 ppm, and less than 2 ppm, respectively, the alumina purity was 99.99%, the specific surface area was 1.9 m$^2$/g, and the amount of water adsorbed was 0.06% by weight. That is, the obtained α-alumina powder contained a small amount of water adsorbed and had a low closed porosity and a high loosed bulk density.

Example 14

α-Alumina powder was prepared in the same manner as in Example 1 except that 5.6 parts of the α-alumina seed particles was added per 100 parts by weight of α-alumina to be obtained and the amount of water in the slurry was changed to 150 parts by weight per 100 parts by weight of aluminum hydroxide to obtain a mixture of the α-alumina precursor and the α-alumina seed particles, and the dried mixture was fired at a temperature of 1310° C. for 4 hours.

This powder had a relative density of 86% and a closed porosity of less than 0.01%. In the weight-based particle size distribution of this powder, the amount of particles having a particle size of less than 75 μm was 3.6% by weight, the amount of particles having a particle size exceeding 2.8 mm was 2.4% by weight, one frequency maximum peak appeared in a range of 100 μm or more and to less than 212 μm. Furthermore, the amount of particles having a particle size of 850 μm or more and less than 1 mm was 3.3% by weight, and one frequency maximum peak appeared in a range of 1 mm or more and less than 2 mm, D2 was 10 times larger than D1, and the M1/M2 ratio was 2.36, and the loosed bulk density of the powder was 2.4 g/cm$^3$. The contents of Si, Na, Mg, Cu, Fe and Ca in the powder were 9 ppm, 2 ppm or less, 2 ppm, 2 ppm, 5 ppm, and less than 2 ppm, respectively, the alumina purity was 99.99%, the specific surface area was 0.5 m$^2$/g, and the amount of water adsorbed was 0.02% by weight. That is, the obtained α-alumina powder contained a small amount of water adsorbed and had a low closed porosity and a high loosed bulk density.

Example 15

The mixture of the α-alumina precursor and the α-alumina seed particles, which was prepared in the same manner as in Example 1, was fired at a temperature of 1275° C. for 4 hours in the same manner as in Example 1 to obtain α-alumina powder.

This powder had a relative density of 72% and a closed porosity of less than 0.01%. In the weight-based particle size distribution of this powder, the amount of particles having a particle size of less than 75 μm was 6.5% by weight, the amount of particles having a particle size exceeding 2.8 mm was 1.9% by weight, one frequency maximum peak appeared in a range of 100 μm or more and to less than 212 μm. Furthermore, the amount of particles having a particle size of 850 μm or more and less than 1 mm was 3.7% by weight, and one frequency maximum peak appeared in a range of 1 mm or more and less than 2 mm, D2 was 10 times larger than D1, and the M1/M2 ratio was 2.54, and thus the loosed bulk density of the powder was 1.9 g/cm$^3$. The contents of Si, Na, Mg, Cu, Fe and Ca in the powder were 7 ppm, 2 ppm or less, 1 ppm, less than 1 ppm, 6 ppm, and less than 2 ppm, respectively, the alumina purity was 99.99%, the specific surface area was 1.5 m$^2$/g, and the amount of water adsorbed was 0.05% by weight. That is, the obtained α-alumina powder contained a small amount of water adsorbed and had a low closed porosity and a high loosed bulk density.

Example 16

The mixture of the α-alumina precursor and the α-alumina seed particles, which was prepared in the same manner as in Example 1, was fired at a temperature of 1350° C. for 4 hours in the same manner as in Example 1 to obtain α-alumina powder.

This powder had a relative density of 85% and a closed porosity of 2.3%. In the weight-based particle size distribution of this powder, the amount of particles having a particle size of less than 75 μm was 2.7% by weight, the amount of particles having a particle size exceeding 2.8 mm was 3.3% by weight, one frequency maximum peak appeared in a range of 100 μm or more and to less than 212 μm. Furthermore, the amount of particles having a particle size of 850 μm or more and less than 1 mm was 4.0% by weight, and one frequency maximum peak appeared in a range of 1 mm or more and less than 2 mm, D2 was 10 times larger than D1, and the M1/M2 ratio was 1.22, and thus the loosed bulk density of the powder was 2.4 g/cm$^3$. The contents of Si, Na, Mg, Cu, Fe and Ca in the powder were 7 ppm, 2 ppm or less, 1 ppm, less than 1 ppm, 6 ppm, and less than 2 ppm, respectively, the alumina purity was 99.99%, the specific surface area was 0.3 m$^2$/g, and the amount of water adsorbed was 0.02% by weight. That is, the obtained α-alumina powder contained a small amount of water adsorbed and had a low closed porosity and a high loosed bulk density.

Comparative Example 1

The α-alumina powder prepared in the same manner as in Example 1 was sieved to obtain α-alumina powder, which contained no particle having a particle size of less than 850 μm and had a frequency maximum peak only in a range of 1 mm or more and less than 2 mm, in the weight-based frequency particle size distribution. This α-alumina powder contained 14.5% by weight of particles having a particle size exceeding 2.8 mm but had no frequency maximum peak in a range of 100 μm or more and to less than 850 μm. Therefore, this α-alumina powder had a low loosed bulk density of 1.7 g/cm$^3$ and thus it had a decreased filling property in a crucible. Accordingly, sapphire could not be efficiently produced from this α-alumina powder.

Comparative Example 2

The α-alumina powder prepared in the same manner as in Example 1 was sieved to obtain α-alumina powder, which had each one maximum peak in a range of 710 μm or more and less than 850 μm and in a range of 1 mm or more and less than 2 mm and D2 that was 1.4 times larger than D1, in the weight-based frequency particle size distribution. This α-alumina powder contained 0% by weight of particles having a particle size of less than 75 μm, 13.6% by weight of particles having a particle size exceeding 2.8 mm and 3.3% by weight of particles having a particle size of 850 μm or more and less than 1 mm, and a M1/M2 ratio of 0.06. However, since D2 was 1.4 times larger than D1, this α-alumina powder had a low loosed bulk density of 1.7 g/cm$^3$ and thus it had a decreased filling property in a crucible. Accordingly, sapphire could not be efficiently produced from this α-alumina powder.

Comparative Example 3

The α-alumina powder prepared in the same manner as in Example 1 was sieved to obtain α-alumina powder having each one maximum peak in a range of 100 μm or more and to less than 212 μm and in a range of 1 mm or more and less than 2 mm and a M1/M2 ratio of 0.02 in the weight-based frequency particle size distribution. This α-alumina powder contained 0.1% by weight of particles having a particle size of less than 75 μm, 13.0% by weight of particles having a particle size exceeding 2.8 mm and 3.4% by weight of particles having a particle size of 850 μm or more and less than 1 mm, and D2 was 10 times larger than D1. However, since a M1/M2 ratio was less than 0.05, this α-alumina powder had a low loosed bulk density of 1.7 g/cm$^3$ and thus it had a decreased filling property in a crucible. Accordingly, sapphire could not be efficiently produced from this α-alumina powder.

Comparative Example 4

α-Alumina seed particles and aluminum hydroxide were mixed in the same manner as in Example 13 to obtain a mixture containing an α-alumina precursor without drying the mixture and then the mixture was fired at a temperature of 1310° C. for 4 hours in the same manner as in Example 1 to obtain α-alumina powder.

This powder had a relative density of 84%, the contents of Si, Na, Mg, Cu, Fe and Ca in the powder were 9 ppm, 2 ppm or less, 1 ppm, 2 ppm, 5 ppm, and less than 2 ppm, respectively, the alumina purity was 99.99%, the specific surface area was 0.3 m$^2$/g, and the amount of water adsorbed was 0.02% by weight. However, the closed porosity was as high as 9.5%. Therefore, this powder was not suitable as a raw material for the production of sapphire.

Furthermore, in the weight-based particle size distribution of this powder, the amount of particles having a particle size of less than 75 μm was 0.3% by weight, one frequency maximum peak appeared in a range of 300 μm or more and less than 425 μm, the amount of particles having a particle size of 850 μm or more and less than 1 mm was 3.7% by weight, one frequency maximum peak appeared in a range of 1 mm or more and less than 2 mm, D2 was 3.3 times larger than D1, and the M1/M2 ratio was 0-0.41. However, since no drying was performed, the powder contained 34.6% by weight of particles having a particle size exceeding 2.8 mm and the loosed bulk density of the powder was decreased to 1.5 g/cm$^3$. Thus, the powder had a decreased filling property in a crucible. Accordingly, sapphire could not be efficiently produced from this α-alumina powder.

Comparative Example 5

α-Alumina seed particles and aluminum hydroxide were mixed in the same manner as in Example 1 except that the amount of water in the slurry was change to 1000 parts by weight per 100 parts by weight of aluminum hydroxide, and the mixture was dried with an evaporator, and then fired at a temperature of 1300° C. for 2 hours to obtain α-alumina.

This powder had a relative density of 61% and a closed porosity of less than 0.01%. In the weight-based particle size distribution of this powder, the amount of particles having a particle size of less than 75 μm was 0.5% by weight, one frequency maximum peak appeared in a range of 100 μm or more and to less than 212 μm, the amount of particles having a particle size of 850 μm or more and less than 1 mm was 6.1 by weight, one frequency maximum peak appeared in a range of 1 mm or more and less than 2 mm, D2 was 10 times larger than D1, and the M1/M2 ratio was 0.06. However, since any drying operation of the fluidized layer was not performed, the powder contained 28.0% by weight of particles having a particle size exceeding 2.8 mm and the loosed bulk density of the powder was decreased to 1.3 g/cm$^3$. Thus, the powder had a decreased filling property in a crucible. Accordingly, sapphire could not be efficiently produced from this α-alumina powder. Furthermore, the powder had a specific surface area of 3.3 m$^2$/g and an amount of water adsorbed of as high as 0.07% by weight. Therefore, this powder was not suitable as a raw material for the production of sapphire.

Comparative Example 6

The mixture of the α-alumina precursor and the α-alumina seed particles, which was prepared in the same manner as in Example 1, was fired at a temperature of 1100° C. for 2 hours in the same manner as in Example 1 to obtain α-alumina powder.

This powder had a closed porosity of less than 0.01%. In the weight-based particle size distribution of this powder, the amount of particles having a particle size of less than 75 μm was 1.3% by weight, the amount of particles having a particle size exceeding 2.8 mm was 6.1% by weight, one frequency maximum peak appeared in a range of 100 μm or more and to less than 212 μm, the amount of particles having a particle size of 850 μm or more and less than 1 mm was 2.2% by weight, one frequency maximum peak appeared in a range of 1 mm or more and less than 2 mm, D2 was 10 times larger than D1, and the M1/M2 ratio was 1.78. However, since the sintering did not sufficiently proceed, the powder had a relative density of 42% and a low loosed bulk density of 1.3 g/cm$^3$ so that the filling property of the powder in a crucible decreased. Accordingly, sapphire could not be efficiently produced from this α-alumina powder. Furthermore, the powder had a specific surface area of 9.2 m$^2$/g and an amount of water adsorbed of as high as 0.37% by weight. Therefore, this powder was not suitable as a raw material for the production of sapphire.

Comparative Example 7

The mixture of the 1-alumina precursor and the α-alumina seed particles, which was prepared in the same manner as in Example 1, was fired at a temperature of 1500° C. for 2 hours in the same manner as in Example 1 to obtain α-alumina powder.

In the weight-based particle size distribution of this powder, the amount of particles having a particle size of less than 75 μm was 1.6% by weight, the amount of particles having a particle size exceeding 2.8 mm was 2.1% by weight, one frequency maximum peak appeared in a range of 100 μm or more and to less than 212 μm, the amount of particles having a particle size of 850 μm or more and less than 1 mm was 4.3% by weight, one frequency maximum peak appeared in a range of 1 mm or more and less than 2 mm, D2 was 10 times larger than D1, and the M1/M2 ratio was 0.95. The powder had a loosed bulk density of 2.4 g/cm$^3$ and thus it was α-alumina powder with a high bulk density. However, since the sintering proceeded excessively, the specific surface area of the powder decreased to 0.02 m$^2$/g, the relative density thereof was 95% and the closed porosity was as high as 5%. Therefore, this powder was not suitable as a raw material for the production of sapphire.

Comparative Example 8

The mixture of the 1-alumina precursor and the α-alumina seed particles, which was prepared in the same manner as in Example 1, was fired at a temperature of 1300° C. for 15 minutes in the same manner as in Example 1 to obtain α-alumina powder.

This powder had a closed porosity of less than 0.01%. In the weight-based particle size distribution of this powder, the amount of particles having a particle size of less than 75 μm was 1.9% by weight, the amount of particles having a particle size exceeding 2.8 mm was 5.0% by weight, one frequency maximum peak appeared in a range of 100 μm or more and to less than 212 μm, the amount of particles having a particle size of 850 μm or more and less than 1 mm was 2.3% by weight, one frequency maximum peak appeared in a range of 1 mm or more and less than 2 mm, D2 was 10 times larger than D1, and the M1/M2 ratio was 2.08. However, since the sintering did not sufficiently proceed, the powder had a relative density of 43% and a low loosed bulk density of 1.6 g/cm³ so that the filling property of the powder in a crucible decreased. Accordingly, sapphire could not be efficiently produced from this α-alumina powder. Furthermore, in this powder, the specific surface area was 4.1 m²/g and the amount of water adsorbed was as large as 0.14% by weight. Therefore, this powder was not suitable as a raw material for the production of sapphire.

The invention claimed is:

1. α-Alumina powder having a purity of at least 99.99% by weight, a specific surface area of from 0.1 to 2.0 m²/g, a relative density of from 55 to 90%, and a closed porosity of 4% or less, wherein in a weight-based particle size distribution obtained by a dry sieving test according to JIS K0069 (1992), an amount of particles having a particle size of less than 75 μm is 5% by weight or less; an amount of particles having a particle size exceeding 2.8 mm is 15% by weight or less; and at least one frequency maximum peak appears in a particle size range of 100 μm or more and to less than 850 μm, provided that a particle size is the largest mesh size of a standard sieve through which α-alumina powder particle cannot pass among the standard sieves according to JIS Z8801 (1987).

2. The α-Alumina powder according to claim 1, wherein, in the particle size distribution, an amount of particles having a particle size of 850 μm or more and less than 1 mm is 10% by weight or less, and at least one frequency maximum peak appears in a particle size range of at least 1 mm, wherein D2 and D1 satisfies the relationship (1):

$$2D_1 \leq D_2 \leq 20D_1 \quad (1)$$

and a ratio of M1 to M2 (M1/M2) is at least 0.05 wherein D2 is a maximum particle size corresponding to the frequency maximum peak having the largest maximum particle size among the frequency maximum peaks appearing in the above range and M2 is the maximum value thereof, and D1 is a maximum particle size corresponding to the frequency maximum peak having the smallest maximum particle size among the frequency maximum peaks appearing in a range of 100 μm or more and to less than 850 μm and M1 is the maximum value thereof.

3. The α-Alumina powder according to claim 1, wherein each content of Si, Na, Ca, Fe, Cu and Mg is 10 ppm or less.

4. The α-Alumina powder according to claim 1, which is used as a raw material for the production of sapphire.

* * * * *